(12) United States Patent
Kim

(10) Patent No.: US 7,688,873 B2
(45) Date of Patent: Mar. 30, 2010

(54) LASER CHIPS AND VERTICAL EXTERNAL CAVITY SURFACE EMITTING LASERS USING THE SAME

(75) Inventor: Jun-youn Kim, Suwon-si (KR)

(73) Assignee: Samsung Electronics, Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/978,568

(22) Filed: Oct. 30, 2007

(65) Prior Publication Data

US 2008/0117946 A1    May 22, 2008

(30) Foreign Application Priority Data

Nov. 22, 2006   (KR) .................... 10-2006-0116059

(51) Int. Cl.
*H01S 3/04*       (2006.01)
*H01S 5/00*       (2006.01)

(52) U.S. Cl. .................... 372/34; 372/36; 372/49.01

(58) Field of Classification Search ............. 372/49.01, 372/50.124, 50.11, 34, 36, 96
See application file for complete search history.

(56) References Cited

U.S. PATENT DOCUMENTS

| 7,397,829 | B2* | 7/2008 | Yoo et al. ............... 372/22 |
| 2007/0104241 | A1* | 5/2007 | Kim et al. ........... 372/50.124 |
| 2007/0147455 | A1* | 6/2007 | Kim et al. ............. 372/50.11 |
| 2007/0217472 | A1* | 9/2007 | Collins et al. ........ 372/50.124 |

* cited by examiner

*Primary Examiner*—Armando Rodriguez
(74) *Attorney, Agent, or Firm*—Harness, Dickey & Pierce, P.L.C.

(57) ABSTRACT

Example embodiments may provide an increased efficiency laser chip and/or a vertical external cavity surface emitting laser (VECSEL) using the same. Example embodiment laser chips may include a substrate; a DBR (distributed Bragg reflector) layer on the substrate, an active layer on the DBR layer having multiple quantum wells excited by a pump beam to generate light, and/or an upper coating layer on the active layer by alternately stacking first and second layers each having different refractive indexes. Thicknesses of the first and second layers may be substantially equal to a quarter of a wavelength of light generated by the active layer.

19 Claims, 6 Drawing Sheets

LASER CHIPS AND VERTICAL EXTERNAL CAVITY SURFACE EMITTING LASERS USING THE SAME

PRIORITY STATEMENT

This application claims priority under 35 USC §119 to Korean Patent Application No. 10-2006-0116059, filed on Nov. 22, 2006, in the Korean Intellectual Property Office (KIPO), the entire contents of which are incorporated herein by reference.

BACKGROUND

1. Field

Example embodiments may relate to a laser chip and/or a vertical external cavity surface emitting laser (VECSEL) using the same, for example, to a laser chip having improved efficiency and increased modal gain and/or a VECSEL using the laser chip.

2. Description of the Related Art

Vertical external cavity surface emitting lasers (VECSELs) may have increased gain regions by using an external mirror instead of an upper mirror for a vertical cavity surface emitting laser (VCSEL) and may obtain higher output power of several tens of watts (W) or higher.

FIG. 1 is a schematic view illustrating a related art VECSEL 10. As shown in FIG. 1, the VECSEL 10 may include a laser chip 12 on a heat sink 11, a concave folding mirror 15 opposite the laser chip 12, a flat external mirror 18 that may reflect light reflected from the folding mirror 15 back to the folding mirror 15, a birefringent filter 13 between the laser chip 12 and the folding mirror 15 that transmits only light of a specific wavelength, and/or a second harmonic generation (SHG) crystal 14 between the folding mirror 15 and the flat external mirror 18.

The VECSEL 10 may further include a pump laser 16 for providing a pump beam to the laser chip 12 and/or a lens 17 for focusing the pump beam on the laser chip 12. Although FIG. 1 illustrates a VECSEL 10 in which the pump laser 16 may provide the pump beam to the front of the laser chip 12, the pump beam may be provided to the back of the laser chip 12. The laser chip 12 may include an active layer 12c and/or a distributed Bragg reflector (DBR) layer 12b stacked on a substrate 12a. The active layer 12c may have multiple quantum wells having, for example, a resonant periodic gain (RPG) structure, and may be excited by a pump beam, causing the active layer 12c to emit light having specific wavelengths.

If the pump beam emitted from the pump laser 16 is incident upon the laser chip 12, an active layer 12c in the laser chip 12 may be excited, thereby causing the active layer 12c to emit light. Light emitted from the laser chip 12 may pass through the birefringent filter 13, and/or may be reflected by the folding mirror 15 toward the flat external mirror 18. Light may be sequentially reflected by the flat external mirror 18 and the folding mirror 15 and then may be incident on the laser chip 12. A portion of light may be absorbed by the active layer 12c, and any remainder of light may be reflected by the DBR layer 12b. Thus, light may resonate between the DBR layer 12b and the flat external mirror 18. A cavity between the DBR layer 12b and the flat external mirror 18 may be concave and bounded by the folding mirror 15.

The SHG crystal 14 between the folding mirror 15 and the flat external mirror 18 may double the frequency of incident light (that is, it may half its wavelength). Light wavelength-converted by the SHG crystal 14 may be reflected by the flat external mirror 18 and then may pass to the outside through the folding mirror 15. A surface of the flat external mirror 18 may be coated so that both light that is wavelength-converted and light that is not wavelength-converted may be reflected. Alternatively, the folding mirror 15 may be coated so that light that is not wavelength-converted may be reflected with increased reflectivity and light that is wavelength-converted may be transmitted through the mirror with increased transmissivity.

As shown in FIG. 2, a laser chip 12' may have an anti-reflection coating 12d on the active layer 12c so that a pump beam may reach the active layer 12c with less reflection loss. As shown in FIG. 3, if a pump beam is provided to the rear of the laser chip, a laser chip 20 may include a substrate 21 having an opening in a central part thereof, a heat spreader 22 on the substrate 21, a DBR layer 23 on the heat spreader 22, an active layer 24 on the DBR layer 23, and/or a pump beam reflective layer 25 that may reflect a pump beam from the active layer 24 back to the active layer 24.

In related art laser chips, the phase of light resonating in a cavity may be shifted due to the anti-reflection coating and/or the pump beam reflective layer on an active layer, and utilization of the pump beam may be reduced. A multiple quantum well layer in the active layer may coincide with an anti-node of a standing wave in a cavity. If the phase of the standing wave is shifted due to the anti-reflection layer and/or pump beam reflective layer, the location of the anti-node of the standing wave may not coincide with the location of the multiple quantum well layer. As a result, the output of a laser chip which has an anti-reflection coating or the pump beam reflective layer thereon (See graph of FIG. 4B) may be of lesser quality compared with the output property of a laser chip which has no additional layer thereon (See a graph of FIG. 4A).

If an additional layer is on the active layer, an additional gain, which may be caused by a resonating effect in a sub-cavity between an upper surface of the active layer and the DBR layer, may be reduced.

SUMMARY

Example embodiments may provide a laser chip having improved efficiency by increasing modal gain and may include a higher efficiency vertical external cavity surface emitting laser (VECSEL) using the laser chip.

Example embodiments may provide a laser chip including a substrate, a distributed Bragg reflector (DBR) layer on the substrate, an active layer on the DBR layer, multiple quantum wells excitable by a pump beam to generate light, and/or an upper coating layer on the active layer by alternately stacking first and second layers having different refractive indices. Thicknesses of the upper coating layer may be a length corresponding to a quarter of a wavelength of light generated from the active layer.

The first layer may be stacked first on the active layer and the second layer having a higher refractive index may be stacked thereon.

Reflectivity of an interface between the active layer and the upper coating layer may be in the range of about 0 to about 30%.

Alternatively, the second layer may be stacked first and the first layer having a lower refractive index may be stacked thereon.

Reflectivity of an interface between the active layer and the upper coating layer may be in the range of about 30 to about 90%.

The first layer may be formed of, for example, AlAs and/or $SiO_2$, and the second layer with a relatively higher refractive index may be formed of, for example, AlGaAs and/or $TiO_2$.

The upper coating layer may be formed by repeatedly stacking the first layer and the second layer alternately.

The laser chip may further include a thermally conductive and optically transmissive heat spreader on the upper coating layer.

The substrate may include an opening formed in the middle of the substrate so that a pump beam may pass through the substrate and be incident on the active layer.

The heat spreader may be formed of, for example, diamond, $Al_2O_3$, silicon carbide (SiC), and/or another suitable material.

The laser chip may further include a thermally conductive and optically transmissive heat spreader on the substrate and the DBR layer.

Example embodiments may provide a vertical external cavity surface emitting laser (VECSEL) including a laser chip, a pump laser for providing a pump beam to the laser chip, and/or an external mirror forming an external cavity together with a DBR layer in the laser chip. The laser chip may include a substrate, a distributed Bragg reflector (DBR) layer on the substrate, an active layer on the DBR layer, multiple quantum wells in the DBR layer excited by a pump beam to generate light, and/or an upper coating layer on the active layer formed of alternately stacked first and second layers having different refractive indexes. Thicknesses of the upper coating layer may be a length corresponding to a quarter of a wavelength of light generated from the active layer.

The VECSEL may further include a folding mirror opposite to the laser chip in a light path between the laser chip and the external mirror that may reflect light generated from the laser chip toward the external mirror.

The VECSEL may further include a birefringent filter between the laser chip and the folding mirror that may transmit only light having of a specific wavelength.

The VECSEL may further include a second harmonic generation (SHG) crystal between the folding mirror and the external mirror that may double the frequency of light generated from the laser chip.

BRIEF DESCRIPTION OF THE DRAWINGS

The above and other features and/or advantages of example embodiments will be more clearly understood from the following detailed description taken in conjunction with the accompanying drawings, in which.

DETAILED DESCRIPTION

Figure 1:
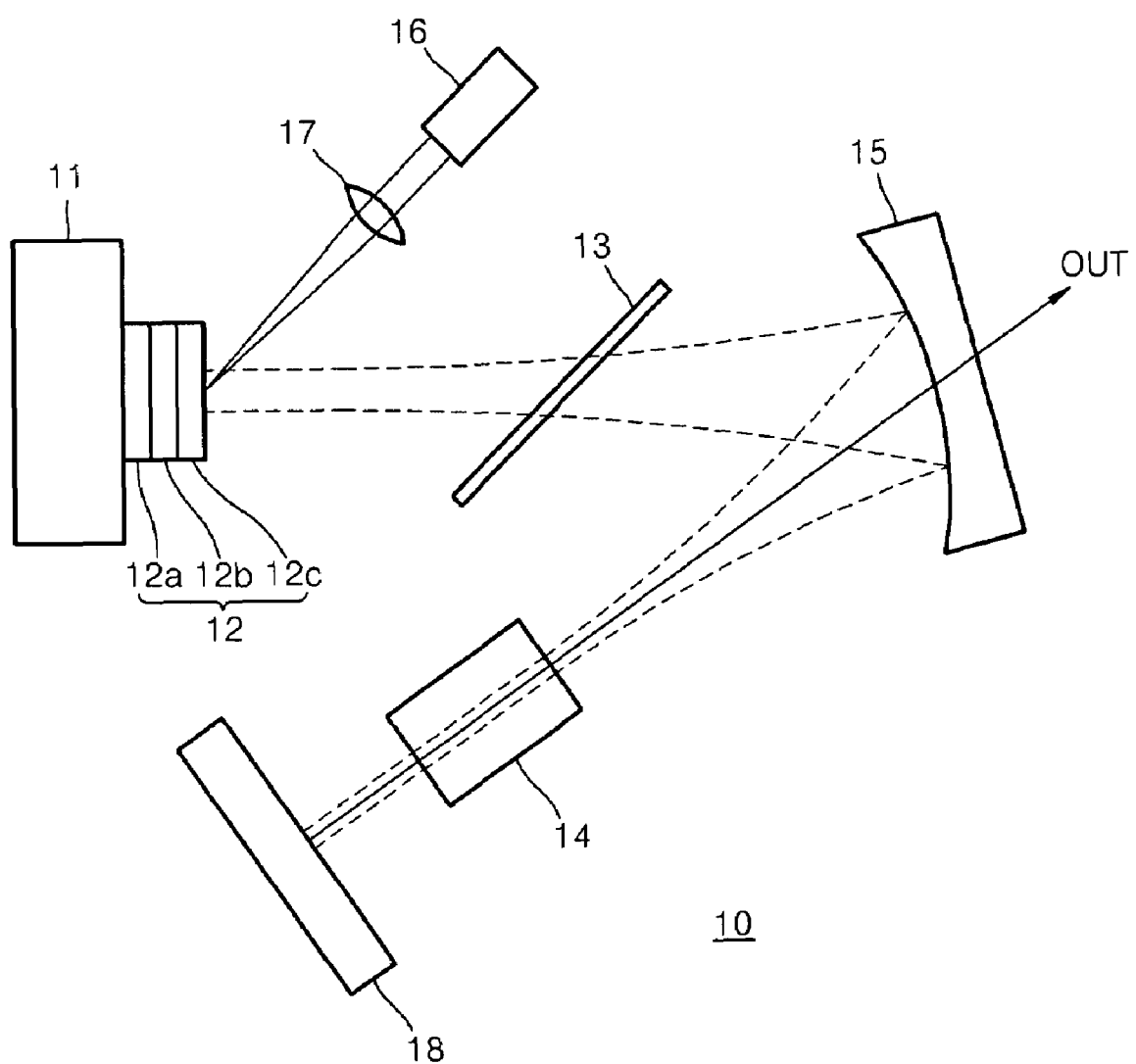
FIG. 1 is a schematic view of a related art vertical external cavity surface emitting laser (VECSEL)
Figure 2:
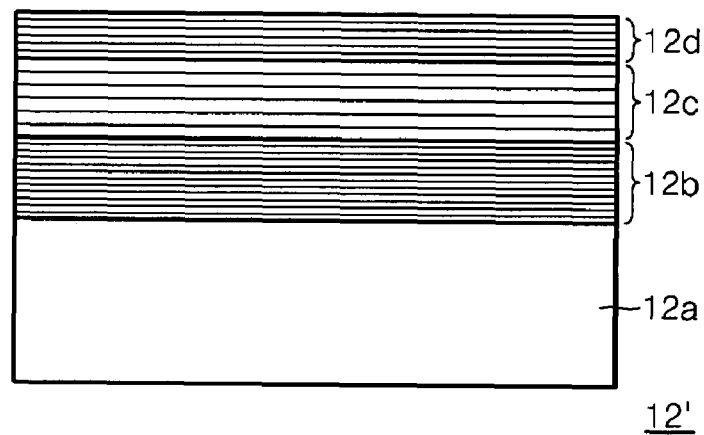
FIG. 2 is a schematic view of a related art laser chip.
Figure 3:
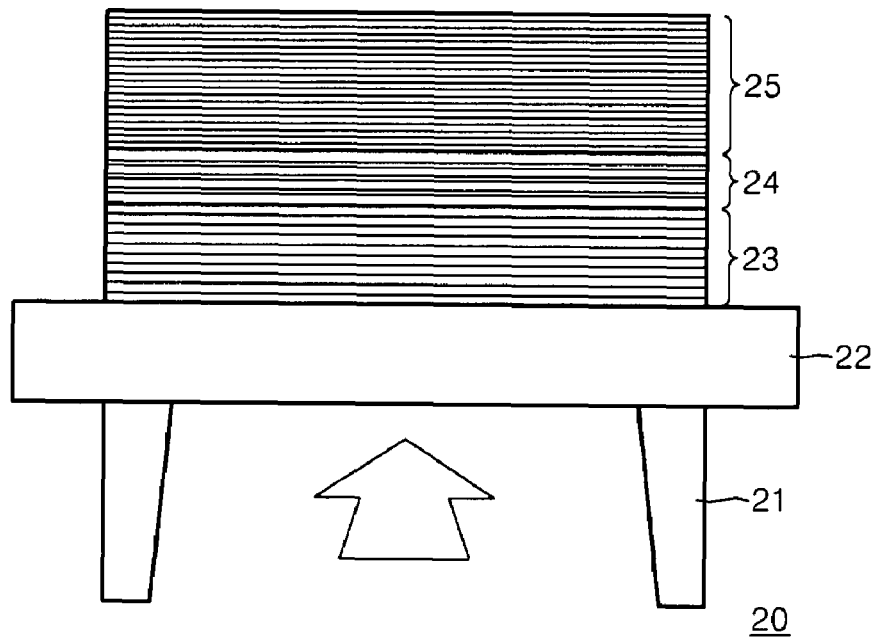
FIG. 3 is a schematic view of another related art laser chip.
Figure 4A:
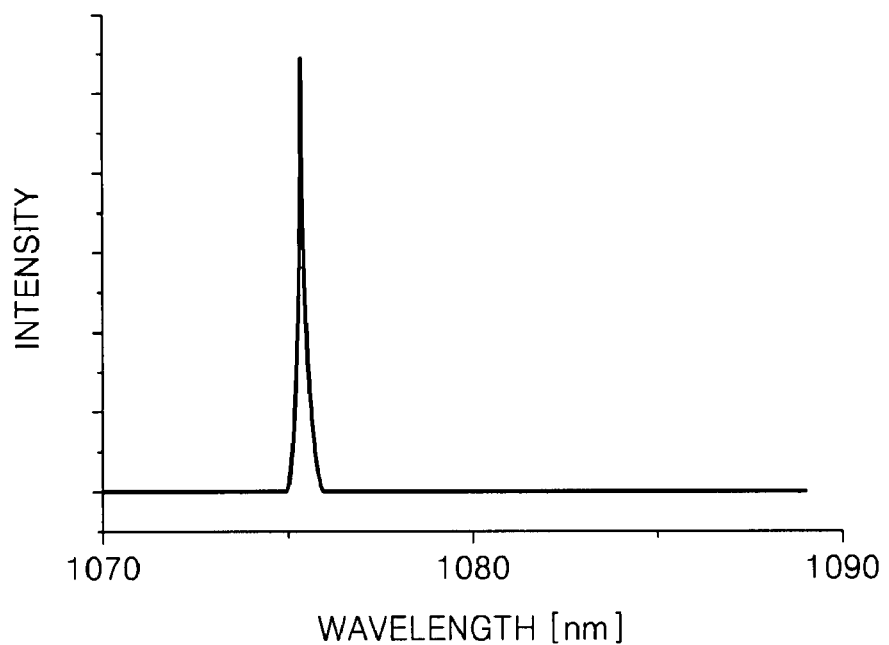
FIGS. 4A and 4B are graphs comparing characteristics of the related art laser chips of FIGS. 2 and 3.
Figure 4B:
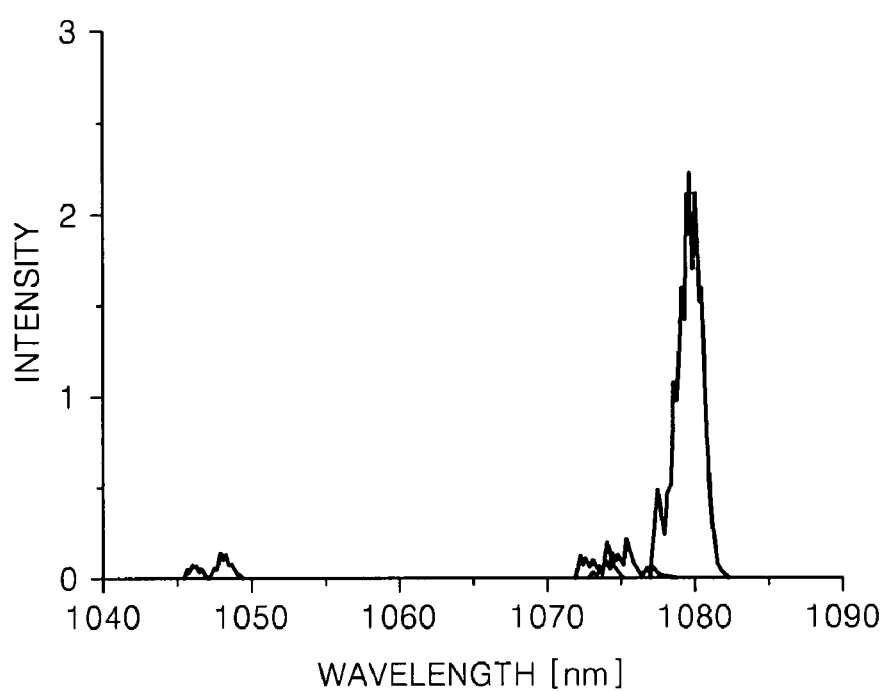

Hereinafter, example embodiments will be described in detail with reference to the attached drawings. In the drawings, the thicknesses and widths of layers are exaggerated for clarity. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
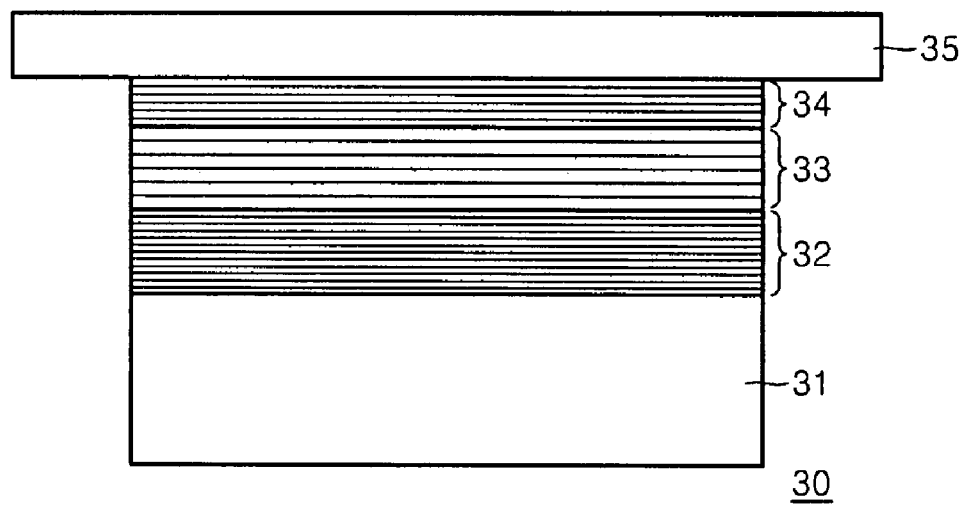
FIG. 5 is a schematic view of an example embodiment laser chip of a VECSEL.

FIG. 5 is a schematic view of a laser chip 30 usable in example embodiment vertical external cavity surface emitting lasers (VECSELs). As shown in FIG. 5, the laser chip 30 may include a substrate 31, a distributed Bragg reflector (DBR) layer 32 on the substrate 31, an active layer 33 on the DBR layer 32, and/or an upper coating layer 34 on the active layer 33. A heat spreader 35 for cooling the active layer 33 by dissipating heat generated from the active layer 33 to the surroundings may be on the upper coating layer 34. The heat spreader 35 may be formed of, for example, diamond, $Al_2O_3$, silicon carbide (SiC), and/or another suitable material.

The active layer 33 may have multiple quantum wells having a resonant periodic gain (RPG) structure and may be excited by a pump beam, causing the active layer 33 to emit light having of a determinable wavelength. The DBR layer 32 may be a mirror layer having increased reflectivity so that it may reflect light generated by the active layer 33 to an external mirror (not shown). Reflected light may resonate between the external mirror and the DBR layer 32. Multiple quantum wells in the active layer 33 may coincide with an antinode of a standing wave of light resonating between the external mirror and the DBR layer 32.

As described above, related art laser chips may include a coating layer on an upper surface of an active layer in order to improve utilization of a pump beam. The upper coating layer 34 on the active layer 33 may increase modal gain, which may be obtained from resonance in a sub-cavity between the upper surface of the active layer 33 and the DBR layer 32. To achieve resonance, the upper coating layer 34 may have a multi-layer structure formed by alternately stacking two layers, each having a unique refractive index. That is, the upper coating layer 34 may be formed by alternately stacking a layer having a relatively higher refractive index and a layer having a relatively lower refractive index. For example, the higher refractive index layer may be formed of a semiconductor material such as AlGaAs and/or a dielectric material such as $TiO_2$. The lower refractive index layer may be formed of, for example, a semiconductor material such as AlAs and/or a dielectric material such as $SiO_2$. The upper coating layer 34 may have a structure formed by alternately stacking, for example, AlGaAs/AlAs layers and $TiO_2/SiO_2$ layers.

Thicknesses of the higher refractive index layer and the lower refractive index layer may each be about $\lambda/4$. Here, $\lambda$ may be an oscillating wavelength of light generated by the active layer 33 resonating in a cavity. If the thickness of each of the layers of the upper coating layer 34 is about a quarter of the wavelength of the resonating light, the phase of the resonating light in the cavity may not be shifted due to the upper coating layer 34. Thus, output of example embodiment laser chips 30 may not deteriorate.

In addition, a sub-cavity may be formed by the upper coating layer 34 together with the DBR layer 32 on a lower part of the active layer 33. That is, a portion of the light generated by the active layer 33 may be reflected by the upper coating layer 34, and the remainder of light may proceed toward the external mirror. Light reflected by the upper coating layer 34 may pass thorough the active layer 33, may be reflected by the DBR layer 32, and may be again incident on the upper coating layer 34. As a result, of the portion of light may be repeatedly reflected between the upper coating layer 34 and the DBR layer 32, and thereby may resonate. The sub-cavity between the upper coating layer 34 and the DBR layer 32 may be a type of Fabry-Perot resonator. Because only light having specific wavelengths within a narrow bandwidth may be amplified due to the resonance between the upper coating layer 34 and the DBR layer 32, an improved modal gain may be obtained in example embodiment laser chips. If an example embodiment laser chip 30 is used, the entire optical power of the VECSEL may also be increased.

Figure 8:
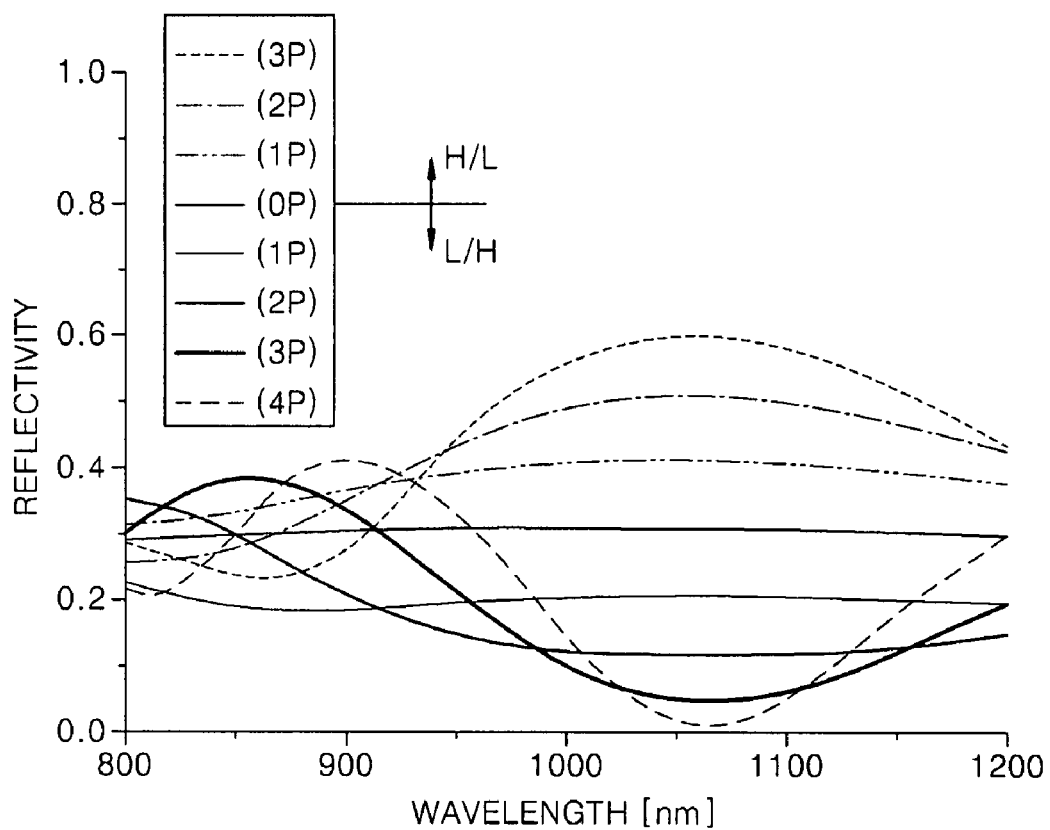
FIG. 8 is a graph illustrating reflectivity of layers included in an upper coating layer on an active layer in example embodiments.

The modal gain may be adjusted according to the reflectivity between the active layer 33 and the upper coating layer 34. FIG. 8 is a graph illustrating reflectivity of the structure of layers included in the upper coating layer 34 formed on the active layer 33. The reflectivity of the graph is measured with respect to light proceeding from the active layer 33 toward the upper coating layer 34.

If an additional coating layer is not formed on the active layer 33, the reflectivity of light having an oscillating wavelength of about 1060 nm incident on an interface between the active layer 33 and external air may be about 30% (curve indicated by OP in FIG. 8). If the higher refractive index layer H having a relatively higher refractive index is stacked first on the active layer 33 and the lower refractive index layer L having a relatively lower refractive index is stacked later on the active layer 33 (denoted H/L), the upper coating layer 34 may have increased reflectivity of light having the oscillating wavelength. As more pairs of layers including the higher refractive index layer and the lower refractive index layer H/L are stacked, the reflectivity may be further increased. If the lower refractive index layer L is stacked first on the active layer 33 and the higher refractive index layer H is stacked later on the lower refractive index layer L, (denoted L/H), the upper coating layer 34 may have reduced reflectivity of light having the oscillating wavelength. As more pairs of layers including the lower refractive index layer and the higher refractive index layer L/H are stacked, the reflectivity may be further reduced. As shown in FIG. 8, if a pair of layers including the lower refractive index layer and the higher refractive index layer L/H are stacked four times (4P), the reflectivity of light having the oscillating wavelength may be about 0%. FIG. 8 includes curves showing the reflectivity of the pair of layers including the higher refractive index layer and the lower refractive index layer H/L stacked in three pairs, but pairs of layers in a stack may be increased until the reflectivity with respect to light of the oscillating wavelength may be about 90%.

If the higher refractive index layer is stacked first and the lower refractive index layer is stacked later, the reflectivity of the upper coating layer 34 may be in a range of about 30% to about 90%. The upper coating layer 34 may function as a higher reflective (HR) coating. If the lower refractive index layer is stacked first and the higher refractive index layer is stacked later, reflectivity of the upper coating layer 34 may be in the range of about 0% to about 30%. The upper coating layer 34 may function as an anti-reflective (AR) coating.

Figure 9:
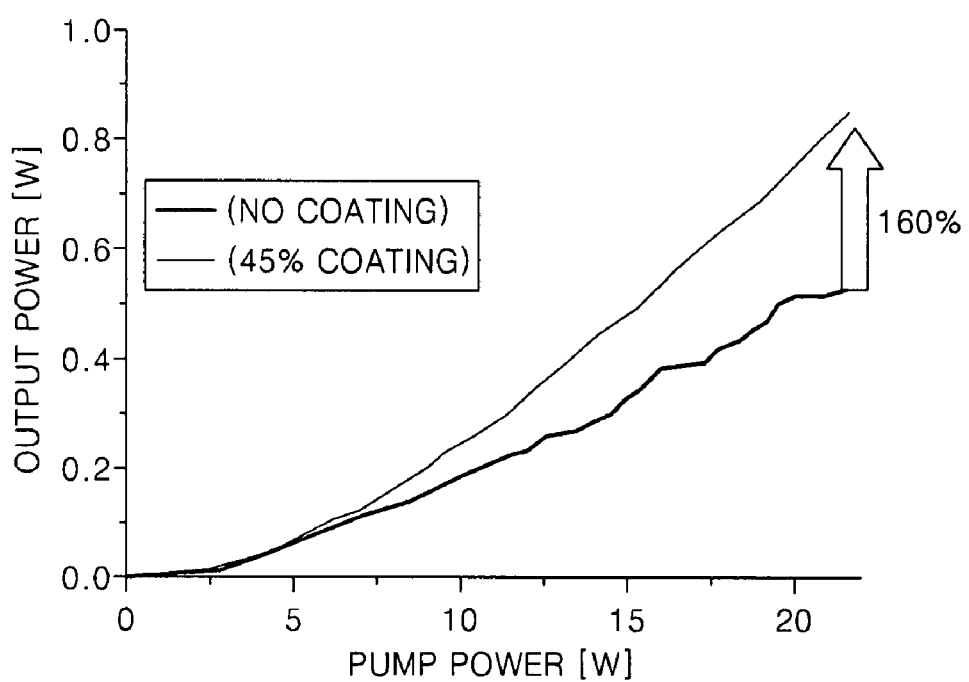
FIG. 9 is a graph illustrating improvement of performance of an example embodiment VECSEL.

If the upper coating layer 34 functions as the HR coating, a resonance effect in a sub-cavity may be increased to improve modal gain. Efficiency of a VECSEL may be improved by improving the modal gain. FIG. 9 is a graph illustrating optical power of a VECSEL comparing the VECSEL having no upper coating layer and having an example embodiment upper coating layer 34 with a reflectivity of about 45%. The optical power of FIG. 9 may be based on the laser chip 30 used a VECSEL. As shown in the graph of FIG. 9, an example embodiment VECSEL may achieve performance improved by about 160% if the upper coating layer 34 is on the active layer 33 compared to the related art where the upper coating layer 34 may not be on the active layer 33.

If the upper coating layer 34 functions as an AR coating, because reflection loss may be reduced without shifting a phase of the resonating light, performance of the VECSEL may be also improved.

Figure 6:
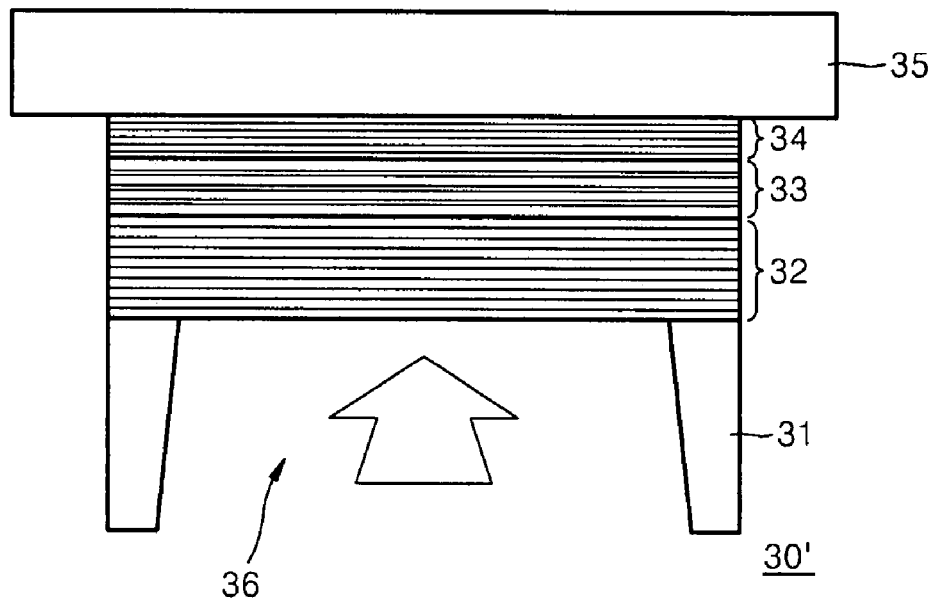
FIG. 6 is a schematic view of an example embodiment a laser chip of a VECSEL.
Figure 7:
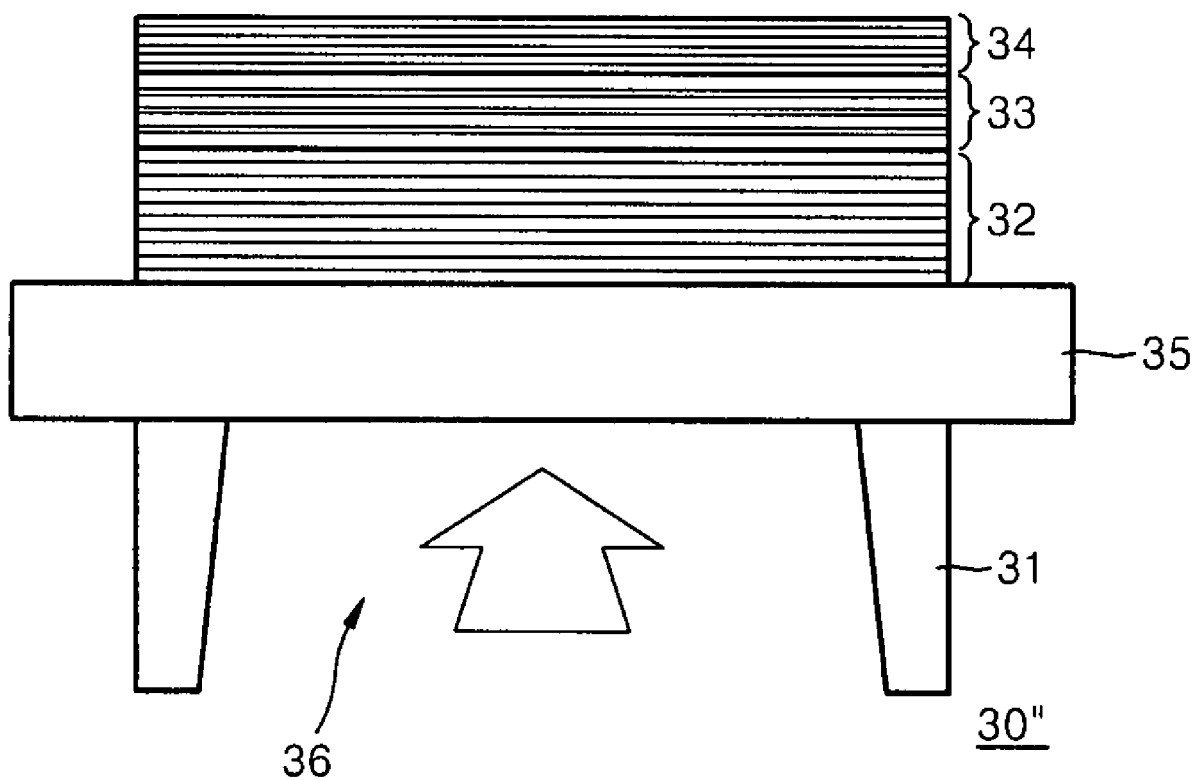
FIG. 7 is a schematic view of an example embodiment laser chip of a VECSEL.

Various changes in form and details may be made to example embodiments. For example, in FIGS. 6 and 7, which are schematic views illustrating example embodiment laser chips, the laser chip 30 of FIG. 5 may be mainly used for a front-pumped type VECSEL in which a pump beam is incident upon an upper surface of the active layer 33. For an end-pumped type VECSEL in which a pump beam may be incident on a lower surface of the active layer 33, a laser chip 30' of FIG. 6 may be used. As shown in FIG. 6, an opening 36 may be formed in the middle of a substrate 31 so that the pump beam may pass through the substrate 31 and/or be incident on an active layer 33. As shown in FIG. 7, the structure may be substantially similar to FIG. 6, except that a heat spreader 35 may be between a substrate 31 and a DBR layer 32. In the laser chip 30 of FIG. 5, the heat spreader 35 may be between the substrate 31 and the DBR layer 32.

Example embodiment laser chip 30 may be used in a VECSEL. Accordingly, an example embodiment VECSEL may include the laser chip 30, 30' and/or 30", a concave folding mirror opposite to the laser chip 30, 30' and/or 30", a flat external mirror reflecting back to the folding mirror, a birefringent filter between the laser chips 30, 30' and/or 30" and the folding mirror that may pass light of a specific wavelength, and/or a second harmonic generation (SHG) crystal between the folding mirror and the flat external mirror.

Phase shift of light may be prevented or reduced by stacking the higher refractive index layer and the lower refractive index layer having thicknesses of about a quarter of an oscillating wavelength on an active layer. A higher reflective coating or an anti-reflective coating may be on an active layer according to the order of the higher refractive index layer and the lower refractive index layer in the stack. If the higher reflective coating is on the active layer, a resonating effect in a sub-cavity may be increased to improve modal gain. If the anti reflective coating is on the active layer, reflection loss may be reduced or minimized. If example embodiment laser chips are used, efficiency of an example embodiment VECSEL may be improved.

While example embodiments have been particularly shown and described with reference to example embodiments thereof, it will be understood by those of ordinary skill in the art that various changes in form and details may be made therein without departing from the spirit and scope of the following claims.

What is claimed is:

1. A laser chip comprising:
a substrate;
a Distributed Bragg Reflector (DBR) layer on the substrate;
an active layer on the DBR layer, the active layer having a plurality of quantum wells configured to generate light if excited by a pump beam;
a heat spreader in contact with a layer of the laser chip, the layer of the laser chip not including the active layer, the heat spreader being thermally conductive and optically transmissive; and
an upper coating layer on the active layer, the upper coating layer including, at least one first layer having a first refractive index and a thickness of about one-fourth of a wavelength of the light generated by the active layer, and
at least one second layer having a second refractive index and a thickness of about one-fourth of a wavelength of the light generated by the active layer, the at least one second layer being alternately stacked with the at least one first layer.

2. The laser chip of claim 1, wherein the first refractive index is lower than the second refractive index.

3. The laser chip of claim 2, wherein the at least one first layer is stacked first on the active layer and the at least one second layer is stacked last.

4. The laser chip of claim 3, wherein reflectivity of an interface between the active layer and the upper coating layer is about 0% to about 30%.

5. The laser chip of claim 2, wherein the at least one second layer is stacked first on the active layer and the at least one first layer is stacked last.

6. The laser chip of claim 5, wherein reflectivity of an interface between the active layer and the upper coating layer is about 30% to about 90%.

7. The laser chip of claim 1, wherein the at least one first layer includes at least one of AlAs and $SiO_2$, and wherein the at least one second layer includes at least one of AlGaAs and $TiO_2$.

8. The laser chip of claim 1, wherein the upper coating layer includes a plurality of the first layers and a plurality of the second layers, each of the second layers being alternately stacked with each of the first layers.

9. The laser chip of claim 1, wherein the heat spreader is on the upper coating layer.

10. The laser chip of claim 9, wherein the substrate includes an opening configured to allow the pump beam to pass through the substrate and be incident on the active layer.

11. The laser chip of claim 9, wherein the heat spreader includes at least one of $Al_2O_3$ and silicon carbide (SiC).

12. The laser chip of claim 1, wherein the heat spreader is between the substrate and the DBR layer.

13. The laser chip of claim 12, wherein the substrate includes an opening configured to allow a pump beam to pass through the substrate and be incident on the active layer.

14. The laser chip of claim 12, wherein the heat spreader includes at least one of $Al_2O_3$ and silicon carbide (SiC).

15. A Vertical External Cavity Surface Emitting Laser (VECSEL) comprising:
the laser chip of claim 1;
a pump laser configured to provide a pump beam to the laser chip; and
an external mirror, the DBR layer and the external mirror configured to form an external cavity in the laser chip.

16. The VECSEL of claim 15, further comprising:

a folding mirror opposite the laser chip in a light path between the laser chip and the external mirror, the folding mirror configured to reflect light from the laser chip toward the external mirror.

17. The VECSEL of claim 16, further comprising:

a birefringent filter between the laser chip and the folding mirror, the birefringement filter configured to transmit substantially only light having a first wavelength.

18. The VECSEL of claim 16, further comprising:

a second harmonic generation crystal between the folding mirror and the external mirror, the second harmonic generation crystal configured to double the frequency of light passing through the second harmonic generation crystal.

19. The laser chip of claim 1, wherein the heat spreader is not in direct contact with the active layer.

* * * * *